United States Patent
Väisänen

(10) Patent No.: US 7,630,700 B2
(45) Date of Patent: Dec. 8, 2009

(54) MULTI-FUNCTION PASSIVE FREQUENCY MIXER

(75) Inventor: Risto Väisänen, Salo (FI)

(73) Assignee: Nokia Corporation, Espoo (FI)

( * ) Notice: Subject to any disclaimer, the term of this patent is extended or adjusted under 35 U.S.C. 154(b) by 531 days.

(21) Appl. No.: 11/493,566

(22) Filed: Jul. 27, 2006

(65) Prior Publication Data

US 2008/0003971 A1    Jan. 3, 2008

(30) Foreign Application Priority Data

Jun. 30, 2006  (FI) .................................. 20065464

(51) Int. Cl.
*H04B 15/00* (2006.01)
*H04B 1/26* (2006.01)

(52) U.S. Cl. ....................... 455/313; 455/323; 455/326; 455/318; 327/113; 327/124

(58) Field of Classification Search ................. 455/313, 455/318, 323, 326; 327/113, 116, 119, 124
See application file for complete search history.

(56) References Cited

U.S. PATENT DOCUMENTS

| | | | |
|---|---|---|---|
| 4,186,436 A | 1/1980 | Ishiwatari | |
| 4,797,899 A | 1/1989 | Fuller et al. | |
| 4,999,761 A | 3/1991 | Bingham et al. | |
| 5,237,209 A | 8/1993 | Brewer | |
| 5,262,934 A | 11/1993 | Price | |
| 5,397,931 A | 3/1995 | Bayer | |
| 5,475,337 A | 12/1995 | Tatsumi | |
| 5,550,728 A * | 8/1996 | Ellis | 363/60 |
| 5,574,457 A | 11/1996 | Garrity et al. | |
| 5,581,454 A | 12/1996 | Collins | |
| 5,606,491 A | 2/1997 | Ellis | |
| 5,828,560 A | 10/1998 | Alderman | |
| 6,064,871 A * | 5/2000 | Leung | 455/323 |
| 6,091,940 A * | 7/2000 | Sorrells et al. | 455/118 |
| 6,198,645 B1 | 3/2001 | Kotowski et al. | |

(Continued)

FOREIGN PATENT DOCUMENTS

SE    470 298 B    1/1994

OTHER PUBLICATIONS

Crols, Jan et al., "*A 1.5 GHz Highly Linear CMOS Downconversion Mixer*", IEEE Journal of Solid-State Circuits, vol. 30, No. 7, Jul. 1995, pp. 736742.

(Continued)

*Primary Examiner*—Duc M Nguyen
(74) *Attorney, Agent, or Firm*—Squire, Sanders & Dempsey, LLP

(57) ABSTRACT

A frequency-mixing device performing voltage multiplying and low-pass filtering operations in addition to frequency mixing is provided. The three operations may be carried out with the same components by designing the frequency mixer appropriately. The frequency mixer comprises a first capacitance connected in series to the input of the frequency-mixing device, a first switch connected in parallel to the first capacitance, a second switch connected in series to the first capacitance, and a second capacitance connected in parallel to the second switching means. The switches are controlled by a local oscillator signal to close and open alternately according to a change in the voltage level of the first oscillator signal.

27 Claims, 6 Drawing Sheets

U.S. PATENT DOCUMENTS

| | | | |
|---|---|---|---|
| 6,429,632 B1 * | 8/2002 | Forbes et al. | 323/282 |
| 6,675,003 B1 | 1/2004 | Dubash et al. | |
| 6,999,747 B2 | 2/2006 | Su | |
| 7,010,286 B2 * | 3/2006 | Sorrells et al. | 455/313 |
| 7,039,382 B2 | 5/2006 | Shu | |
| 7,062,248 B2 | 6/2006 | Kuiri | |
| 7,212,588 B1 * | 5/2007 | Wong et al. | 375/324 |
| 7,218,899 B2 * | 5/2007 | Sorrells et al. | 455/127.1 |
| 7,248,850 B2 | 7/2007 | Shen | |
| 7,336,938 B1 * | 2/2008 | Wong | 455/296 |
| 7,460,844 B2 | 12/2008 | Molnar et al. | |
| 2005/0176396 A1 | 8/2005 | Miyagi | |
| 2007/0275684 A1 * | 11/2007 | Harada et al. | 455/185.1 |
| 2008/0001659 A1 * | 1/2008 | Vaisanen | 330/7 |
| 2008/0003973 A1 * | 1/2008 | Vaisanen | 455/326 |

OTHER PUBLICATIONS

International search report PCT/FI2007/050389 filed Jun. 26, 2007.
International Search Report, International Application No. PCT/FI2007/050390, Date of Completion: Sep. 21, 2007, Date of Mailing: Oct. 24, 2007, pp. 1-2.
International Search Report, International Application No. PCT/FI2007/050391, Date of Completion: Oct. 23, 2007, Date of Mailing: Oct. 24, 2007, pp. 1-2.

* cited by examiner

MULTI-FUNCTION PASSIVE FREQUENCY MIXER

FIELD

The present invention relates generally to radio frequency telecommunications and particularly to passive radio frequency mixers.

BACKGROUND

Radio transceivers typically include a frequency mixer which converts a signal from a baseband to a radio frequency (RF) band or vice versa. The frequency mixer upconverts a transmission signal from the baseband to the RF band in transmission and/or downconverts a received signal from the RF band to the baseband in reception. Alternatively, the received RF signal may be converted to an intermediate frequency band in some implementations.

The frequency mixer has a signal to be mixed, i.e. upconverted or downconverted, and one or more local oscillator signals as input signals, and it produces an output signal at a frequency which is a linear combination of the frequencies of the input signals. Typically, the local oscillator signals input to the frequency mixer are the same signal but with different phase shifts.

The mixer may be either a passive mixer or an active mixer. Passive mixers have no energy source but an input signal and a local oscillator signal. Accordingly, the output power may not be greater than the input power. Active mixers, on the other hand, require an additional energy source in order to amplify the input signal. Accordingly, the output power may be higher than the input power.

An advantage the active mixer provides over the passive mixer is that the active mixer amplifies the signal being mixed. As a result, the power of the resulting signal is higher when the active mixer is utilized. On the other hand, the amplification results in an increased noise power, too. Additionally, linearity properties of the active mixers are generally quite poor, and the active mixers consume power which may be a limited resource in some implementations.

On the contrary, passive mixers have typically good linearity and noise properties and they do not consume power. Their only drawback is that they attenuate the signal being mixed instead of amplifying it. The level of the attenuation depends on the implementation.

FIG. 1 illustrates a prior-art receiver structure which converts a received radio signal directly to the baseband. The receiver comprises a first amplifier 2 before mixers 4 and 5. The amplifier 2 is typically a low-noise amplifier. Bandpass filters 1 and 3 have been provided before and after the amplifier 2 to remove undesired frequency components. Mixers 4 and 5 mix in-phase (I) and quadrature (Q) components of the received radio signal to the baseband with local oscillator signals LO_0, LO_90, LO_180, and LO_270. The number refers to the phase shift of the respective local oscillator signal. After the downmixing, baseband amplifiers 6 and 7 amplify the downmixed I and Q components, respectively, and low-pass filters 8 and 9 remove harmonic signal components resulting from the downmixing. Amplifiers 10 and 11 further amplify the low-pass filtered signals before analog-to-digital (A/D) conversion in an A/D-converter 12.

Typically, noise figures of the baseband amplifiers 6 and 7 are relatively poor due to flicker noise (known also as 1/f noise), among others. Therefore, the signal levels obtained from the mixers 4 and 5 have to be higher than the noise level of the baseband amplifiers 6 and 7. If the mixers 6 and 7 are passive mixers, the total noise figure of the receiver may be improved only in the first amplifier 2 before the mixers 4 and 5. In this case, the level of the output signal of the amplifier 2 may rise so high that good linearity properties of the passive mixers are wasted. As a consequence, the advantages of the passive mixers over the active mixers are also wasted.

Another problem related to the passive mixers is that designing a low-pass filter following a passive mixer may be difficult. The low-pass filter should be located before the first baseband amplifier in order to prevent cross-modulation and inter-modulation caused by undesired strong signal components. In CMOS implementations, it is hard to define the corner frequency of the filter accurately, since an output impedance of the mixer, the pulse ratio of a local oscillator and the tolerances of capacitance values of the mixer components affect the corner frequency. Thus, the filter is typically arranged to follow the first baseband amplifier, which results in performance close to that of an active mixer. Accordingly, the advantages of the passive mixer are wasted again.

BRIEF DESCRIPTION OF THE INVENTION

An object of the invention is to overcome the limitations and problems related to the conventional frequency mixers by providing an improved frequency mixer, an improved frequency-mixing method and an improved radio transceiver.

According to an aspect of the invention, there is provided a frequency-mixing device. The frequency mixing device comprises a first input port for a local oscillator signal having a frequency adapted to mix an input signal of the frequency-mixing device to a desired frequency, and a second input port for the input signal to be frequency-mixed. The frequency-mixing device further comprises a first capacitance operationally coupled in series between the second input port and an output port of the frequency-mixing device, a first switch operationally coupled between the first capacitance and a ground level, a second switch operationally coupled in series to the first capacitance, and a second capacitance operationally coupled between the second switch and the ground level. The first switch and the second switch are configured to close and open alternately in response to a change in the voltage level of the oscillator signal.

According to another aspect of the invention, there is provided a frequency-mixing device comprising a first input port for a local oscillator signal having a frequency adapted to mix an input signal of the frequency-mixing device to a desired frequency, a balanced input port for an input signal to be frequency-mixed, the balanced input port comprising a first and a second input, and a balanced output port for a frequency-mixed output signal, the balanced output port comprising a first and a second output. The frequency mixing device further comprises a first capacitance operationally coupled in series between the first input of the balanced input port and the first output of the balanced output port, a second capacitance operationally coupled in series between the first input of the balanced input port and the first output of the balanced output port, a first switch operationally coupled between the first capacitance and the second capacitance, a second switch operationally coupled in series to the first capacitance, a third switch operationally coupled in series to the second capacitance, and a third capacitance operationally coupled between the second switch and the third switch. The first switch is configured to close and open alternately with the second switch and the third switch in response to a change in the voltage level of the oscillator signal.

According to another aspect of the invention, there is provided a frequency-mixing method in a frequency-mixing device. The method comprises producing an oscillator signal having a frequency adapted to mix an input signal of the frequency-mixing device to a desired frequency, charging a first capacitance connected in series to an input port of the frequency-mixing device with an input signal sample during the first half cycle of the oscillator signal, and charging a second capacitance operationally coupled with the first capacitance, with the charge in the first capacitance together with the input signal during the second half cycle of the oscillator signal.

According to another aspect of the invention, there is provided a radio transceiver comprising a local oscillator and a frequency-mixing device, wherein the local oscillator is configured to produce a local oscillator signal to be inputted to the frequency-mixing device or to produce a signal to be used in forming the local oscillator signal. The frequency-mixing device comprises a first input port for the local oscillator signal having a frequency adapted to mix an input signal of the frequency-mixing device to a desired frequency, and a second input port for the input signal to be frequency mixed. The frequency-mixing device further comprises a first capacitance operationally coupled in series between the second input port and an output port of the frequency mixing device, a first switch operationally coupled between the first capacitance and a ground level, a second switch operationally coupled in series to the first capacitance, and a second capacitance operationally coupled between the second switch and the ground level. The first switch and the second switch are configured to close and open alternately in response to a change in the voltage level of the oscillator signal.

According to another aspect of the invention, there is provided a frequency-mixing device comprising a local oscillator providing a local oscillator signal having a frequency adapted to mix an input signal of the frequency-mixing device to a desired frequency, a first capacitance operationally coupled in series between an input port and an output port of the frequency-mixing device, a first switch operationally coupled between the first capacitance and a ground level, a second switch operationally coupled in series to the first capacitance, and a second capacitance operationally coupled between the second switch and the ground level. The first switch and the second switch are configured to close and open alternately in response to a change in the voltage level of the oscillator signal.

The invention provides several advantages. Firstly, the invention provides three functions with the same components. The invention functions as a frequency mixer, voltage multiplier, and low-pass filter and, therefore, the space required in an integrated circuit to perform these functions may be reduced. The invention provides a good linearity and a good noise figure at the same time, and it is particularly advantageous in multi-mode mobile phones which operate on several frequency bands. Previously, it has been difficult to design a bandpass filter to follow the low-noise amplifier due to the changing frequency bands. The invention does not require a separate bandpass filter between the low-noise amplifier and the frequency mixer, since it also operates as a low-pass filter and filters out the undesired frequency components that were filtered by the bandpass filter according to the conventional solution. Furthermore, since the invention multiplies the input voltage while it still is a passive component, i.e. does not consume power, the amplification of the low-noise amplifier may be reduced. This reduces the power consumption of the device utilizing the invention.

LIST OF DRAWINGS

In the following, the invention will be described in greater detail with reference to the embodiments and the accompanying drawings, in which FIG. 1 illustrates the structure of a conventional radio receiver including conventional frequency mixers;

DESCRIPTION OF THE EMBODIMENTS

Figure 1:
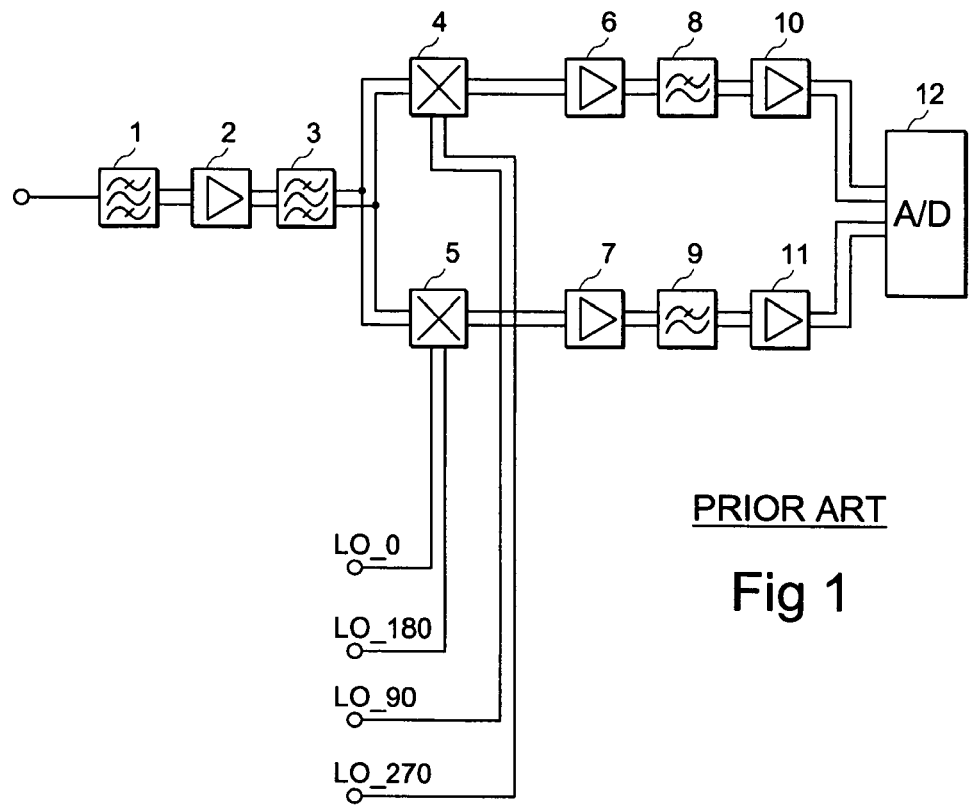
Figure 2:
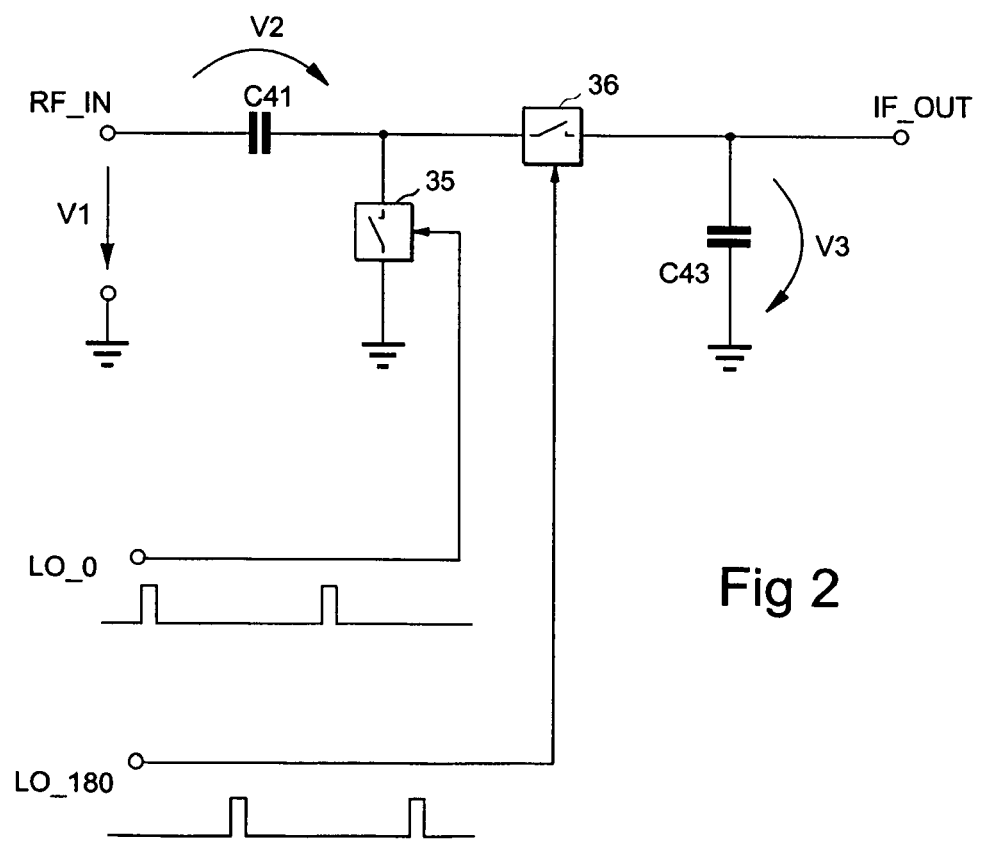
FIG. 2 illustrates a frequency mixer according to an embodiment of the invention.

With reference to FIG. 2, let us examine an example of the frequency mixer according to an embodiment of the invention. The frequency mixer according to the embodiment of the invention functions as a frequency mixer, voltage multiplier, and a low-pass filter. The frequency mixer according to the embodiment of the invention is a passive mixer, i.e. it does not introduce additional power to the input signal. With proper utilization of passive components, the amplitude of an input signal may, however, be multiplied. The embodiment of the invention described with reference to FIG. 2 functions as a voltage doubler.

The frequency mixer has a radio frequency (RF) signal RF_IN as an input signal. The frequency mixer also receives two local oscillator signals LO_0 and LO_180 as input signals. The local oscillator signals may be square-wave signals provided by a local oscillator (not shown). The local oscillator signals may both have the same frequency which together with the center frequency of the input signal defines the intermediate frequency where the input signal will be mixed. The local oscillator signals LO_0 and LO_180 have opposite phases. That is, if the phase of the first local oscillator signal LO_0 is zero degrees, the phase of the second local oscillator signal LO_180 is 180 degrees. The first and the second local oscillator signal LO_0 and LO_180 may be produced with one local oscillator producing one local oscillator signal and processed into the first and the second local oscillator signal LO_0 and LO_180 having the same frequency and substantially opposite phases.

The frequency mixer comprises a first capacitance C41 connected in series to the input of the frequency mixer, a first switch 35 connected between the first capacitance C41 and the ground, a second switch 36 connected in series to the first capacitance C41, and a second capacitance C43 connected between the second switch 36 and the ground level. An output signal IF_OUT having the desired frequency (baseband or intermediate frequency) may be obtained from between the second switch 36 and the second capacitance C43. The first switch 35 and the second capacitance C43 are connected to the ground at the other end in this example in order to help the reader in understanding the functionality of the frequency mixer according to the embodiment of the invention. The first local oscillator signal LO_0 controls the first switch 35 and the second local oscillator signal LO_180 controls the second switch 36. The components of the frequency mixer may be implemented with MOS transistors, for example.

Figure 3:
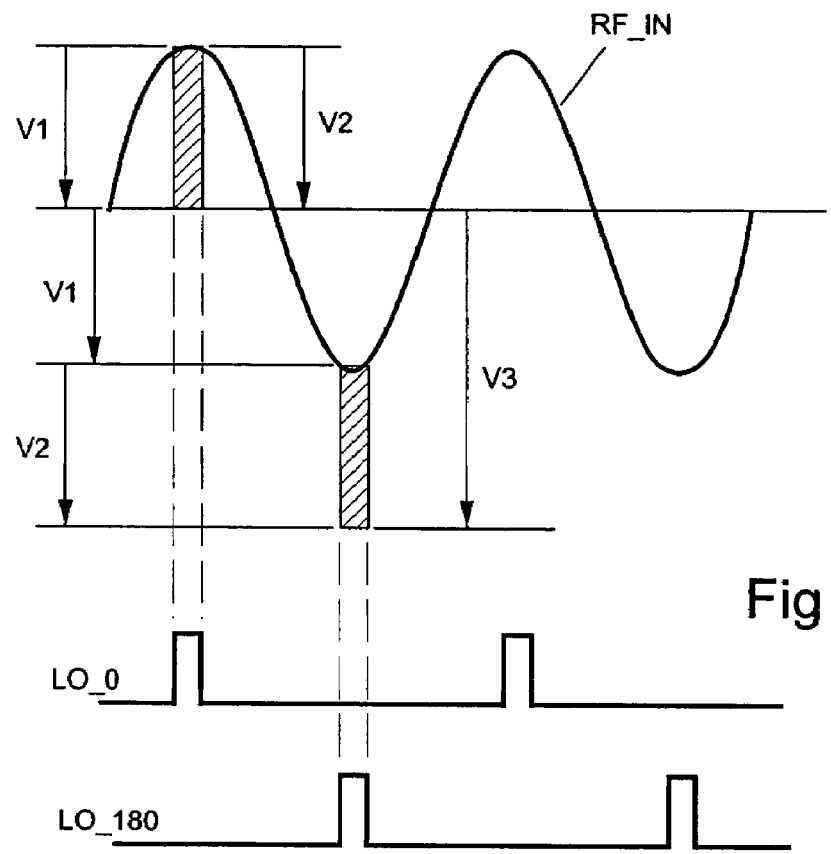
FIG. 3 illustrates an input radio-frequency signal and local oscillator signals of the frequency mixer illustrated in FIG. 2.

In FIG. 3, voltage levels over the first and second capacitances C41 and C43 are denoted by V2 and V3, respectively. Additionally, the input voltage is denoted by V1. The same denotations are also used in FIG. 3.

The frequency of an output signal will be the difference between the frequencies of the input signal and the local oscillator signals LO_0 and LO_180. The amplitude of the output signal depends on the phase between the input signal and the local oscillator signal LO_0. Let us now assume a zero phase shift and that the frequency of the local oscillator signals is the same as that of the input signal for the sake of simplicity. Accordingly, the input signal is downmixed to the baseband. Let us further assume that the pulse ratio of the local oscillator signals LO_0 and LO_180 is such that the voltage level is high for only a short period of time compared to the duty cycle of the square-wave signal. In real implementations, the pulse ratio may be designed to be different. The pulse ratio may be, for example, 50/50, i.e. the voltage is high for the first half cycle and low for the latter half cycle for LO_0, and vice versa for LO_180.

The first local oscillator signal LO_0 controls the first switch 35 to close and connect the first capacitance C41 to the ground when the voltage level of the first local oscillator signal LO_0 is high. Correspondingly, the second local oscillator signal LO_180 controls the second switch 36 to close and connect the first capacitance C41 to the second capacitance C43 and to the output port when the voltage level of the second local oscillator signal LO_180 is high.

The operation of the frequency mixer illustrated in FIG. 2 will now be described with reference to FIG. 3. During the first half cycle of the local oscillator signals LO_0 and LO_180, the first switch 35 is closed according to a change in the voltage level of the first oscillator signal LO_0. That is, the first switch 35 is closed when the voltage level is 'high' and opened once again when the voltage level changes to 'low'. Accordingly, the first capacitance C41 is charged to a voltage level corresponding to the voltage level at the input port of the frequency mixer. In this example, the voltage level of the input signal is now at the positive maximum, as FIG. 3 illustrates. Accordingly, V2 equals V1 at this stage.

During the latter half cycle of the local oscillator signals LO_0 and LO_180, the second switch 36 is closed according to a change in the voltage level of the second oscillator signal LO_180. That is, the second switch 36 is closed when the voltage level is 'high' and opened once again when the voltage level changes to 'low'. Accordingly, the charge in the first capacitance C41 is discharged to the second capacitance C43. Additionally, the voltage level of the input signal has now reached its negative maximum which means that the voltage in the first capacitance C41 and the voltage of the input signal are connected serially and, therefore, they sum together. Accordingly, the second capacitance C43 is charged with a voltage level V3 which is two times higher than the maximum voltage level of the input signal. Referring to FIG. 3, voltage level V1 is now obtained directly from the input port to the second capacitance C43. Additionally the voltage level V2 of the first capacitance C41 is discharged to the second capacitance C43. As a result, voltage level V3=V1+V2 is obtained at the second capacitance C43.

The same procedure is carried out for the next half cycles of the local oscillator signals LO_0 and LO_180. Accordingly, the first and second switches 35 and 36 are opened and closed alternately to enable first charging the first capacitance C41 and then releasing the charge in series together with the input signal to the second capacitance C43. This way, the input RF signal is downmixed to the baseband. Additionally, the output voltage, which is voltage V3, is twice as high as the maximum input voltage level V1. Accordingly, the frequency mixer also functions as a voltage doubler. The amplification of the mixer is approximately 6 dB, which is influenced by the actual implementation and the properties of the components used in the frequency mixer. While the frequency mixer according to the embodiment of the invention does not bring additional power to the input signal, it improves the noise figure of a radio receiver utilizing the frequency mixer.

The principles of the frequency mixer according to the embodiment of the invention are based on charging the first capacitance C41 and discharging it serially with the input signal to the second capacitance C43. This operation of sequentially charging and discharging the first capacitance C43 makes the first capacitance C41 and the first and second switches 35 and 36 to function as a resistor implemented with a switched capacitor filter (SC filter) technique. The SC filter technique is known in the art as such.

Figure 4A:
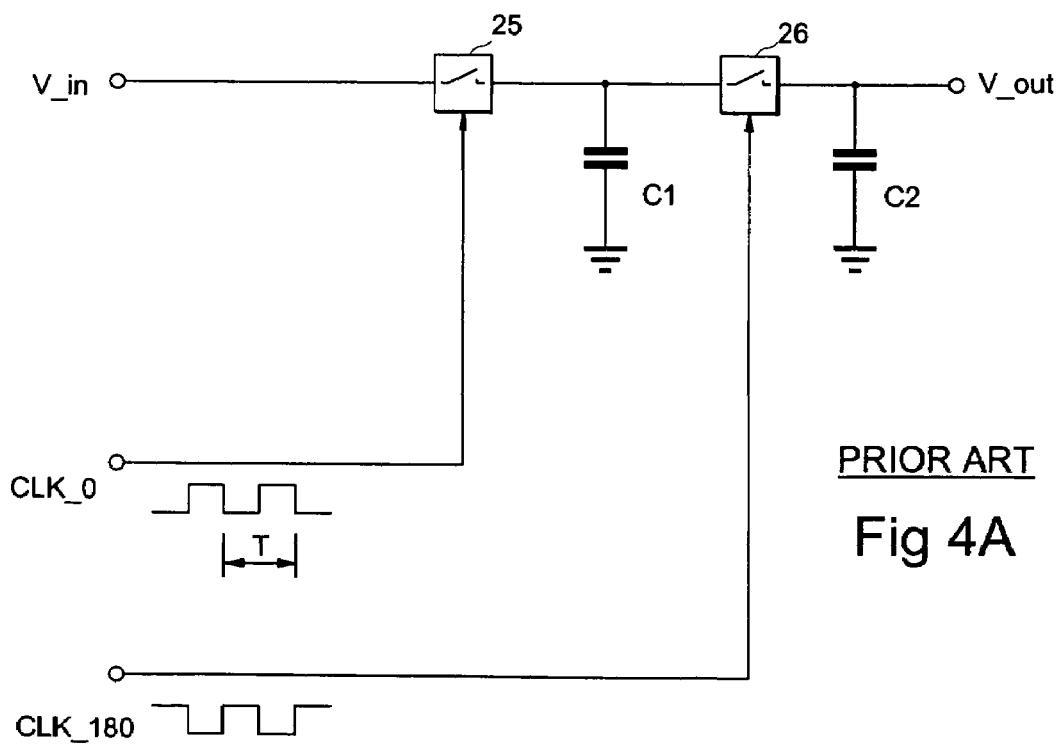
FIG. 4A illustrates a prior-art filter structure implemented according to a switched capacitor filter principle.
Figure 4B:
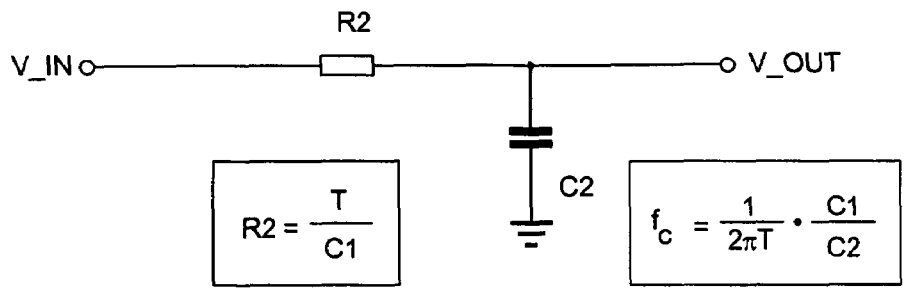
FIG. 4B illustrates an equivalent circuit for the filter structure illustrated in FIG. 4A.

FIGS. 4A and 4B illustrate schematic diagrams of a low-pass filter implemented with the SC filter technique (FIG. 4A) and its equivalent circuit (FIG. 4B) known in the art. Switches 25 and 26 operated according to respective oscillator signals CLK_0 and CLK_180 and a first capacitor between the switches 25, 26 function as a resistor having a resistance R2=T/C1, where T is the period of the oscillator signals CLK_0 and CLK_180 and C1 is the capacitance of the first capacitor. V_in denotes an input port and V_out an output port of the filter. The equivalent circuit is illustrated in FIG. 4B in which the switches 25 and 26 and the first capacitor have been replaced with a resistor having resistance R2. Additionally, the SC filter includes a second capacitor connected in parallel to the second switch 26. The corner frequency of the SC filter is defined as:

$$f_c = \frac{1}{2\pi T} \cdot \frac{C1}{C2}, \qquad (1)$$

where C2 is the capacitance of the second capacitor. It can be seen that if the frequency of the oscillator signals is constant, the corner frequency depends on the ratio of the capacitances C1 and C2. In CMOS implementations, the absolute capacitance values may have a high diversity, but the ratio of the capacitances remains very accurate. That is, the ratio C1/C2 remains quite constant regardless of variations in the absolute values of C1 and C2. Accordingly, the corner frequency may be defined accurately and has only marginal variations.

Consequently, the frequency mixer according to an embodiment of the invention may be used as a low-pass filter by designing the components, i.e. the first and second capacitances C41 and C43, the first and second switches 35 and 36 and the oscillator signals LO_0 and LO_180, properly. Now, the first and second switches 35 and 36 and the first capacitance C41 function as a resistor and the corner frequency is defined by the ratio of the first and second capacitances C41 and C43. Accordingly, the corner frequency is now $$f_c = \frac{1}{2\pi T} \cdot \frac{C41}{C43}. \quad (2)$$

Although the first capacitance C41 is now serially connected to the input port of the frequency mixer, instead of a parallel connection of the first capacitor illustrated in FIG. 4A, it still has the same functionality with respect to the low-pass filtering property of the frequency mixer.

If the frequency mixer is configured to mix the input RF signal to an intermediate frequency instead of a baseband, the corner frequency $f_c$ may be designed to be high enough so that the undesired high-frequency components will be filtered.

The above description of the embodiment of the frequency mixer includes simplifications which help the reader to understand the functionalities of the frequency mixer. For instance, a sinusoidal input signal was considered. In case of a modulated input signal, the effect is, however, the same. Let us assume that the RF frequency of an input signal is 2 GHz and the modulation bandwidth is 2 MHz, and that the input signal is to be mixed to the baseband. In order to produce one period of an output baseband signal, approximately 1,000 periods of the RF signal has to be processed. The operations of charging and discharging the capacitances do not appear in the output signal as single incidences due to the low-pass filtering.

Figure 5:
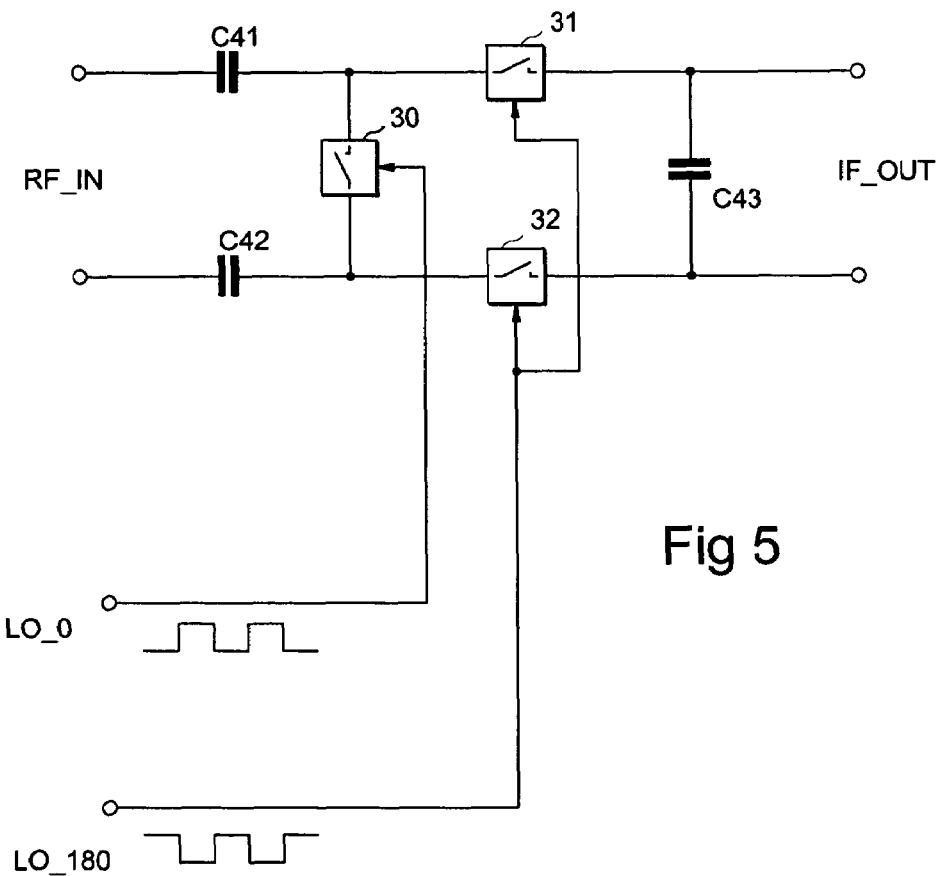
FIG. 5 illustrates a frequency mixer according to an embodiment of the invention, the frequency mixer having a balanced input port.

FIG. 5 illustrates the structure of the frequency mixer according to another embodiment of the invention. The functionality of the frequency mixer illustrated in FIG. 5 is similar to the one described above referring to FIG. 3. The only difference is that an input port and an output port of the frequency mixer of FIG. 5 are now balanced. Accordingly, two input signals are received from two inputs of the balanced input port of the frequency mixer, and two output signals are output to two outputs of the balanced output port. A first capacitance C41 is now operationally coupled between the first input of the balanced input port and the first output of the balanced output port. Accordingly, a second capacitance C42 is operationally coupled between the second input of the balanced input port and the second output of the balanced output port. The first and second capacitances C41 and C42 each have the same functionality as the first capacitance C41 described above with reference to FIG. 3. A first switch 30, which corresponds to a first switch 35 of FIG. 3, is not connected between the first capacitance C41 and the ground in this embodiment but between the first and second capacitances C41 and C42. The second switch 31 corresponds to the second switch 36 of FIG. 3 and, thus, it is controlled according to the local oscillator signal LO_180. The second switch 31 is connected in series between the first capacitance C41 and the first output of the balanced output port. Additionally, the frequency mixer comprises a third switch 32 which functions in the same way as the second switch 31, i.e. it is controlled according to the local oscillator signal LO_180. The third switch 32 is connected in series between the second capacitance C42 and the second output of the balanced output port. The local oscillator signals LO_0 and LO_180 may be the same as described above with a proper pulse ratio. The third capacitance C43 corresponds to the second capacitance C43 described above with reference to FIG. 3, as is evident from the denotations.

The operation of this embodiment of the invention is similar to the embodiment described above. During the first half cycle of the local oscillator signal, the first switch 30 is closed and the switches 31 and 32 remain open. Accordingly, the first and the second capacitances C41 and C42 are charged with the input voltage. During the second half cycle, the first switch is open and the switches 31 and 32 are closed. Now, the first and second capacitances C41 and C42 are discharged to the third capacitance C43. Accordingly, the first switch 30 is configured to close and open alternately with the second and the third switch 31 and 32. The voltage over the first and second capacitances C41 and C42 is coupled serially with the input voltage and, thus, the voltage over the third capacitance C43 is doubled with respect to the total input voltage. Additionally, the structure illustrated in FIG. 5 also functions as a low-pass SC filter for both input ports. The first capacitance C41 and the switches 30 and 31 function as a first resistance, and the second capacitance C42 and the switches 30 and 32 function as a second resistance. Together with the third capacitance, they establish a low-pass filter for both input ports.

The balanced frequency mixer described above represents a simple structure for the balanced frequency mixer according to the embodiment of the invention. Alternatively, the balanced frequency mixer may be implemented in other ways, for example by utilizing two non-balanced frequency mixers. Various structures for the balanced frequency mixers are obvious to one skilled in the art and, thus, these are not discussed herein in greater detail.

The frequency mixer according to yet another embodiment of the invention has a dual-balanced input and output port. The dual-balanced structure may be constructed from two frequency mixers having balanced input and output ports by connecting the local oscillator input ports of the two mixers together with opposite phases. Additionally, the input ports are connected to each other and the output ports are connected to each other. Either the input or the output ports are connected with opposite phases. The construction of the dual-balanced frequency mixer out of two balanced mixers is obvious to one skilled in the art and, thus, it is not described herein in greater detail.

In summary, the frequency mixer according to embodiments of the invention performs the following operations:

1. Frequency-mixes the input signal RF_IN with the local oscillator signal LO, thereby generating an output signal IF_OUT having a frequency which is the difference between the frequencies of the input signal RF_IN and the local oscillator signal LO. Accordingly, $f_{IF\_OUT} = f_{RF\_IN} - f_{LO}$ or $f_{IF\_OUT} = f_{LO} - f_{RF\_IN}$.
2. During the frequency mixing process, doubles the voltage level of the output signal IF_OUT with respect to the voltage level of the input signal RF_IN. Therefore, the output voltage level is twice as high as that of a prior-art passive mixer.
3. During the frequency mixing process, performs low-pass filtering to the output signal IF_OUT. The corner frequency of the low-pass filtering may be defined by the ratio of capacitances in the frequency mixer.
4. Functions as a direct-current blocking device, i.e. effectively blocks DC signal components from reaching the frequency mixer and the later stages of a system the frequency mixer belongs to. The DC blocking functionality is achieved without additional DC blocking capacitors.

Figure 6:
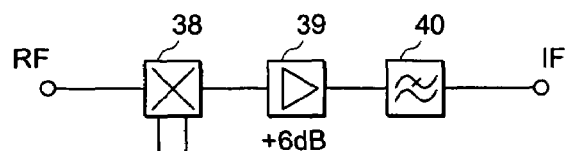
FIG. 6 illustrates functions of the frequency mixer according to an embodiment of the invention.

The functionality of the frequency mixer according to embodiments of the invention corresponds to the block diagram illustrated in FIG. 6. The frequency mixer according to an embodiment of the invention performs the frequency-mixing (block 38), voltage-doubling (block 39), and low-pass filtering (block 40) operations by alternately closing and opening the switches 35 and 36. The only difference is that the operations performed in the three blocks illustrated in FIG. 6 are performed in one block in the frequency mixer according to an embodiment of the invention. Accordingly, the three operations may be carried out with the same components.

Figure 7A:
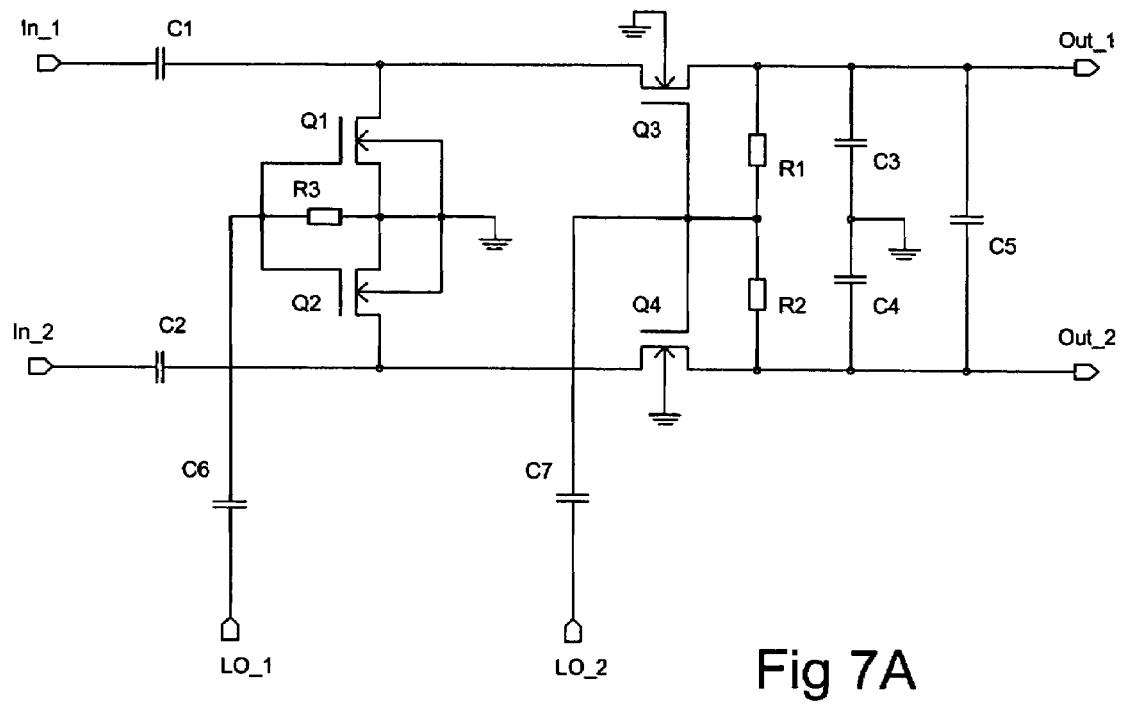
FIG. 7A illustrates a detailed structure for a frequency mixer according to an embodiment of the invention.
Figure 7B:
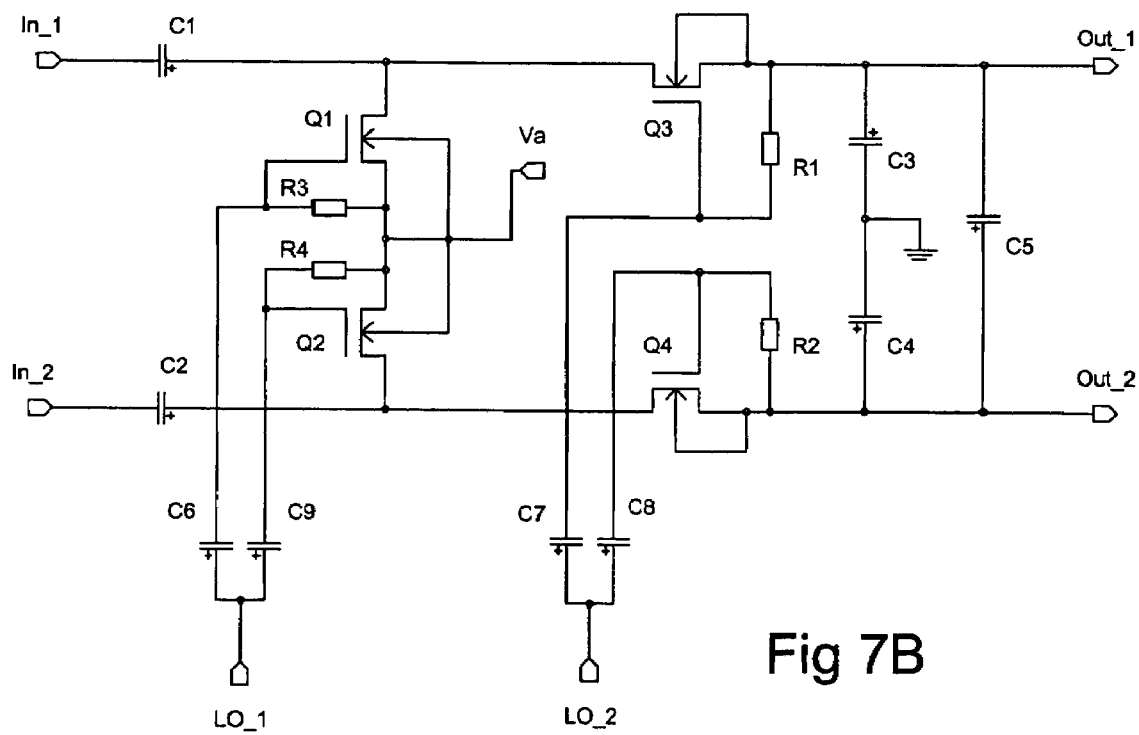
FIG. 7B illustrates a detailed structure for a frequency mixer according to another embodiment of the invention.

FIGS. 7A and 7B illustrate two detailed implementations of a frequency mixer according to embodiments of the invention. Clearly, the implementations have very simple structures. Both implementations are balanced, which is very common in RF integrated circuits nowadays. Accordingly, the analogy between the embodiments described next and the embodiment of the balanced frequency mixer illustrated in FIG. 5 is evident.

In the implementation illustrated in FIG. 7A, capacitors C1 and C2 correspond to the capacitances C41 and C42 of FIG. 4. The first switch 30 has been implemented with two MOS transistors Q1 and Q2. The transistors Q1 and Q2 are implemented such that a local oscillator signal LO_1 (corresponds to LO_0 ) is applied to the gates of the transistors Q1 and Q2. Accordingly, the gates of the transistors Q1 and Q2 are connected to each other. Additionally, the sources of the transistors Q1 and Q2 may be connected directly to each other. Additionally, drains of the transistors Q1 and Q2 are connected to the first capacitance and the second capacitance C1 and C2, respectively. The switch 30 could be implemented with only one MOS transistor but the structure illustrated in FIG. 7A reduces essentially the leakage of the local oscillator signal LO_1 to input ports In_1 and In_2. The second and third switches 31 and 32 have been implemented with MOS transistors Q3 and Q4.

The switches may be implemented by NMOS and/or PMOS transistors, for example. In case all of the switches are NMOS or PMOS transistors, two local oscillator signals having opposite phases may be applied to the frequency mixer, as described above. Alternatively, the transistors Q1 and Q2 may be NMOS transistors, and transistors Q3 and Q4 may be PMOS transistors. Now, two local oscillator signals are not necessary. The same local oscillator signal may be applied to all transistors Q1 to Q4. Transistors Q1 and Q2 are closed during a positive half cycle of the local oscillator signal and open during a negative half cycle of the local oscillator signal. On the other hand, transistors Q3 and Q4 are closed during the negative half cycle of the local oscillator signal and open during the positive half cycle of the local oscillator signal. Of course, Q1 and Q2 may be PMOS transistors, and Q3 and Q4 NMOS transistors.

The third capacitance C43 has been implemented with three capacitances C3, C4, and C5. Capacitances C3 and C4 may be selected to be very small, since their main function is to attenuate the local oscillator signal LO_1 and LO_2.

When designing the SC low-pass filter implemented with the circuit illustrated in FIG. 7A, the starting point is equation (1) described above. Since the implementation relates to an RF circuit, the design cannot be based on equation (1) alone. Issues to be considered in the implementation include the on-resistance of the MOS transistors Q1, Q2, Q3, and Q4, output impedance of the previous stage preceding the frequency mixer (amplifier or band-pass filter, for example), impedance of the load of the frequency mixer, pulse shape and pulse ratio of the local oscillator signal, and various capacitances caused by the components of the frequency mixer.

FIG. 7B illustrates another implementation of the frequency mixer according to an embodiment of the invention. This implementation is almost similar to that described above with reference to FIG. 7A, but now a separate DC voltage source Va may be connected to the gates of the MOS transistors Q1 and Q2 of the first switch 30. The DC voltage supplied by the voltage source Va may be selected arbitrarily. The DC voltage may be selected to be half of the operating voltage of the baseband part of a radio transceiver in which the frequency mixer is utilized. Now, a bias voltage required by the baseband part may be applied to output ports Out_1 and Out_2 of the frequency mixer, while capacitances C1 and C2 separate the frequency mixer from the DC voltage of the previous stage.

In FIGS. 7A and 7B, components R1, R2, R3, R4, C6, C7, C8, and C9 are specific to the implementation, and do not limit the invention in any way.

Figure 8:
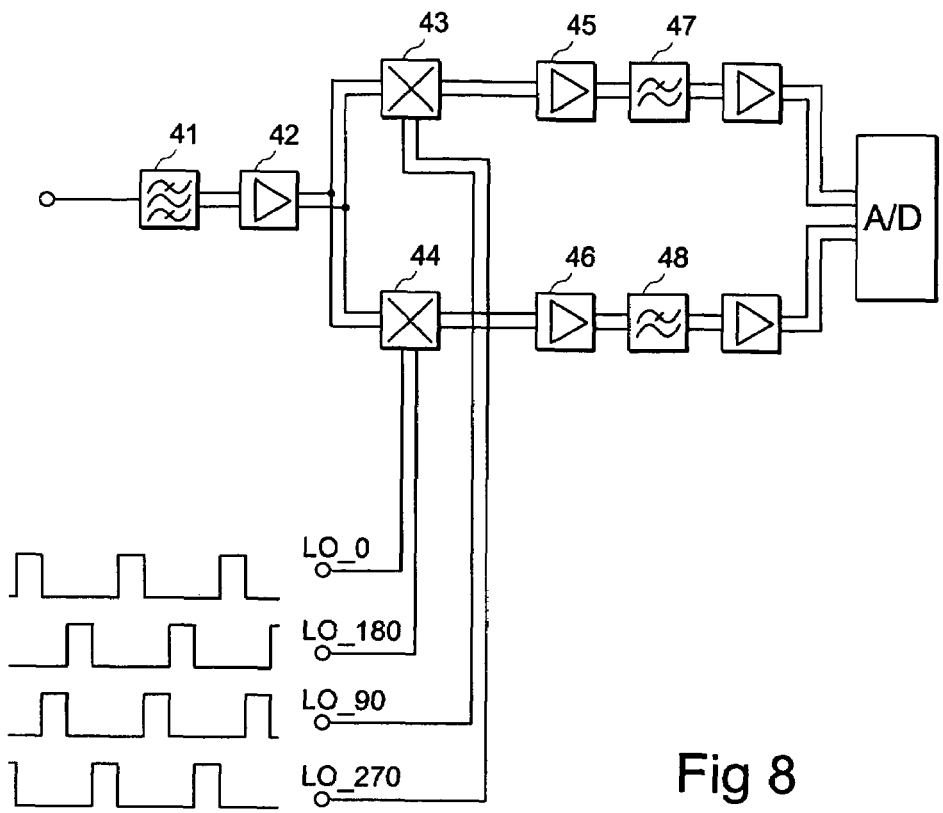
FIG. 8 illustrates the receiver structure of a radio transceiver according to an embodiment of the invention.

FIG. 8 illustrates the structure of a radio receiver (or transceiver) utilizing the frequency mixer according to an embodiment of the invention. Before frequency mixers 43 and 44, a received RF signal is bandpass-filtered in a filter 41 and amplified in a low-noise amplifier 42. The received RF signal is separated into an in-phase (I) component and a quadrature (Q) component with a proper selection of the phases of the local oscillator signal. Local oscillator signals having zero-degree and 180-degree phase shifts LO_0 and LO_180 are applied to a first frequency mixer 44 and local oscillator signals having 90-degree and 270-degree phase shifts LO_90 and LO_270 are applied to a second frequency mixer 43. Frequency-mixed output signals of the frequency mixers 43 and 44 are further amplified in the respective baseband amplifiers 45 and 46 and low-pass filtered in the respective low-pass filters 47 and 48. In this implementation, the pulse ratio of the local oscillator signal may not exceed a ratio of 25/75 in order to prevent the overlapping of the local oscillator signal pulses.

Figure 9:
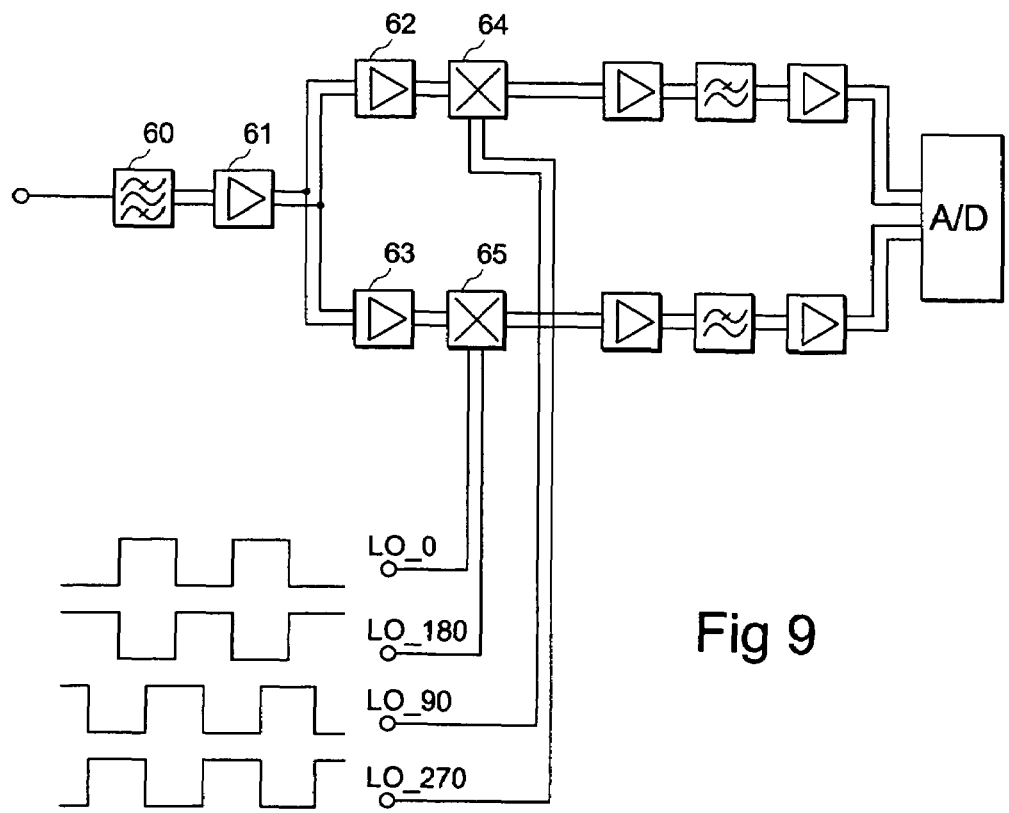
FIG. 9 illustrates the receiver structure of a radio transceiver according to another embodiment of the invention.

FIG. 9 illustrates an implementation in which the pulse ratios of the local oscillator signals LO_0 , LO_90, LO_180 , and LO_270 may be 50/50, since amplifiers 62 and 63 preceding the respective frequency mixers 64 and 65 separate the I and Q components from each other on the input RF port side. The bandpass filter 60 and the low-noise amplifier 61 are common to the I and Q component of the received RF signal.

Figure 10:
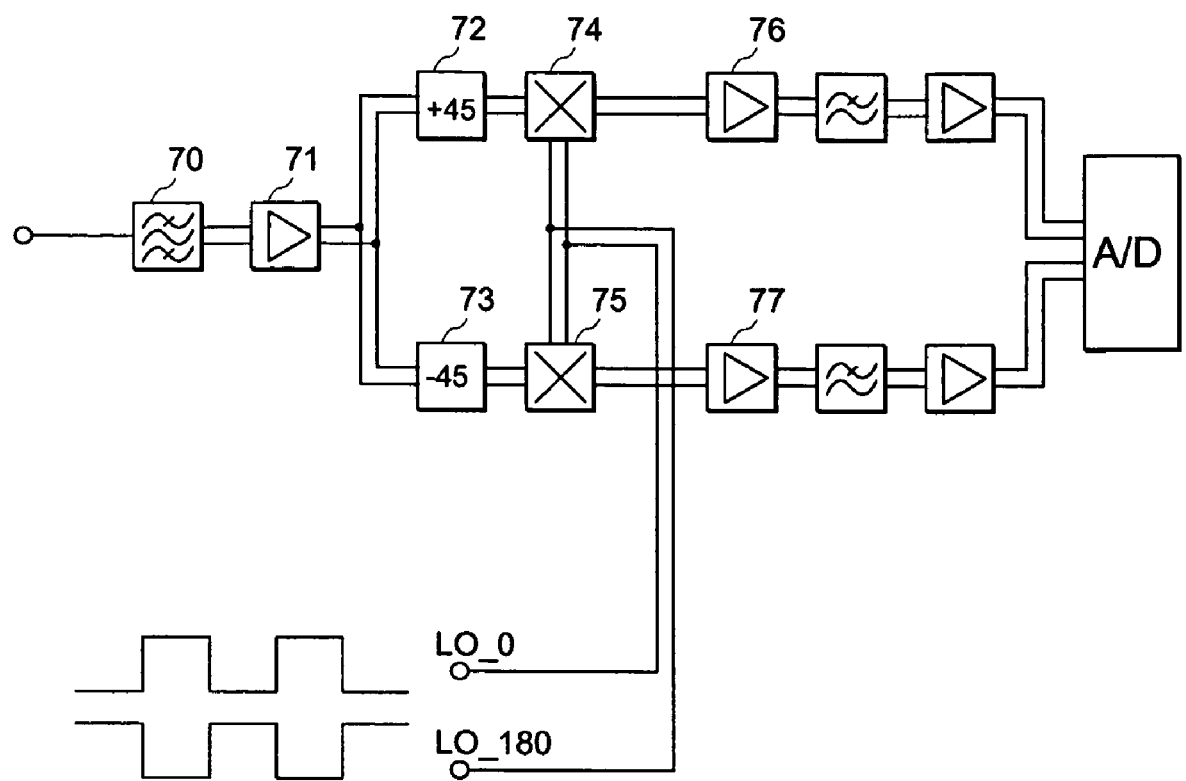
FIG. 10 illustrates the receiver structure of a radio transceiver according to still another embodiment of the invention.

FIG. 10 illustrates an implementation in which the same local oscillator signals LO_0 and LO_180 may be applied to both frequency mixers 74 and 75. Again, a bandpass filter 70 and a low-noise amplifier precede the frequency mixers. Phase shifters 72 and 73 preceding the frequency mixers 74 and 75 shift the phases of an input RF signal by +45 and −45 degrees, respectively, thereby separating the I and Q component. Alternatively, the phase shifters 72 and 73 may shift the phase of the input signal with different phase shifts in order to produce the 90-degree phase shift between the I and Q components. One of the phase shifters 72 and 73 may even be omitted, if the other makes a 90-degree phase shift. After the frequency mixers 74 and 75, the frequency-mixed signals are fed to amplifiers 76 and 77 for further amplification.

A person skilled in the art appreciates that the frequency mixer according to embodiments of the invention and the radio transceiver utilizing the frequency mixer may be implemented in numerous ways. The switches in the frequency mixer may be implemented with GaAs FET transistors, SOI-CMOS transistors, diodes, etc. The frequency mixer may be implemented as an integrated circuit or on a printed circuit board, for instance. The frequency mixer according to an embodiment of the invention may be utilized in virtually any radio communication device. The radio communication device may be a radio transceiver or simply a radio receiver. The radio communication device may be a mobile phone, a Global Positioning System (GPS) receiver, a Galileo receiver, a Wireless Local Area Network (WLAN) transceiver, a Bluetooth® transceiver, an FM radio receiver, a television signal receiver (DVB-T or DVB-H, for example), an AM receiver, a short wave radio transceiver, etc.

The frequency mixers described herein downmix an input RF signal, i.e. convert the input RF signal to the baseband. Alternatively, the frequency mixers according to embodiments of the invention may downmix the input signal to an intermediate frequency (IF). While the frequency mixer according to an embodiment of the invention is preferably utilized in a radio receiver, the frequency mixer may also be implemented as an upconverting frequency mixer which converts an input baseband signal to an RF signal. Even though the invention has been described above with reference to an example according to the accompanying drawings, it is clear that the invention is not restricted thereto but it can be modified in several ways within the scope of the appended claims.

The invention claimed is:

1. A frequency-mixing device comprising:
    a first input port for a local oscillator signal having a frequency adapted to mix an input signal of the frequency-mixing device to a desired frequency;
    a second input port for the input signal to be frequency-mixed;
    a first capacitance operationally coupled in series between the second input port and an output port of the frequency-mixing device;
    a first switch operationally coupled between the first capacitance and a ground level;
    a second switch operationally coupled in series to the first capacitance, and
    a second capacitance operationally coupled between the second switch and the ground level,
    wherein the first switch and the second switch are configured to close and open alternately in response to a change in the voltage level of the oscillator signal.

2. The device of claim 1, wherein the local oscillator signal is the first local oscillator signal, the device further comprising an input port for a second local oscillator signal having the same frequency as the first local oscillator signal and a substantially opposite phase, and wherein the first switch is configured to close and open in response to the first local oscillator signal and the second switch is configured to close and open in response to the second local oscillator signal.

3. The device of claim 2, wherein the switches are implemented with NMOS transistors.

4. The device of claim 1, wherein the mixing device is configured to function also as a voltage multiplier by adapting the oscillator signal to close the first switch and accordingly charge the first capacitance during the first half cycle of the first local oscillator signal, and by adapting the second oscillator signal to close the second switch and accordingly release the charge in the first capacitance together with the input signal to the second capacitance during the second half cycle of the second local oscillator signal.

5. The device of claim 1, wherein the mixing device also functions as a low-pass filter having a corner frequency defined by the ratio of the first capacitance and the second capacitance.

6. The device of claim 1, wherein the output port of the frequency mixing-device is connected between the second switch and the second capacitance.

7. The device of claim 1, wherein the mixing device is configured to convert a radio frequency input signal to a baseband or to an intermediate frequency.

8. The device of claim 1, wherein one of the first switch and the second switch is implemented with an NMOS transistor and the other is implemented with a PMOS transistor.

9. The device of claim 1, further comprising two balanced input ports and output ports, a third capacitance connected in series to one input port, and a third switch, wherein the first capacitance is connected in series to the other input port, the third switch is connected in series to the third capacitance, and the second capacitance is connected between the second switch and the third switch.

10. The device of claim 1, wherein the first switch is implemented with two transistors with gates and sources connected to each other, and a drain of at least one of the transistors connected to the first capacitance.

11. The device of claim 1, wherein a direct current voltage source is connected to the substrates of the transistors.

12. A frequency-mixing device comprising:
    a first input port for a local oscillator signal having a frequency adapted to mix an input signal of the frequency-mixing device to a desired frequency;
    a balanced input port for an input signal to be frequency-mixed, the balanced input port comprising a first input and a second input;
    a balanced output port for a frequency-mixed output signal, the balanced output port comprising a first output and a second output;
    a first capacitance operationally coupled in series between the first input of the balanced input port and the first output of the balanced output port;
    a second capacitance operationally coupled in series between the first input of the balanced input port and the first output of the balanced output port;
    a first switch operationally coupled between the first capacitance and the second capacitance;
    a second switch operationally coupled in series to the first capacitance;
    a third switch operationally coupled in series to the second capacitance, and
    a third capacitance operationally coupled between the second switch and the third switch,
    wherein the first switch is configured to close and open alternately with the second switch and the third switch in response to a change in the voltage level of the oscillator signal.

13. A frequency-mixing method in a frequency-mixing device, the method comprising:
    producing an oscillator signal having a frequency adapted to mix an input signal of the frequency-mixing device to a desired frequency;
    charging a first capacitance connected in series to an input port of the frequency-mixing device with an input signal sample during the first half cycle of the oscillator signal; and
    charging a second capacitance operationally coupled to the first capacitance with the charge in the first capacitance together with the input signal during the second half cycle of the oscillator signal.

14. The method of claim 13, wherein the first capacitance and the second capacitance are charged alternately.

15. The method of claim 13, wherein the local oscillator signal is the first local oscillator signal, the method further comprising:
    producing a second local oscillator signal having the same frequency as the first local oscillator signal and a substantially opposite phase;
    charging the first capacitance during the first half cycle of the first oscillator signal;
    charging the second capacitance during the second half cycle of the second oscillator signal.

16. The method of claim 13, further comprising low-pass filtering the frequency mixed signal by defining a low-pass corner frequency with the ratio of the first capacitance and the second capacitance.

17. The method of claim 13, further comprising obtaining a frequency-mixed output signal from between the first capacitance and the second capacitance.

18. A radio transceiver comprising a local oscillator and a frequency-mixing device, wherein the local oscillator is configured to produce a local oscillator signal to be input to the frequency-mixing device or to produce a signal to be used in forming the local oscillator signal, the frequency-mixing device comprising:
- a first input port for the local oscillator signal having a frequency adapted to mix an input signal of the frequency mixing device to a desired frequency;
- a second input port for the input signal to be frequency-mixed;
- a first capacitance operationally coupled in series between the second input port and an output port of the frequency mixing device;
- a first switch operationally coupled between the first capacitance and a ground level;
- a second switch operationally coupled in series to the first capacitance, and
- a second capacitance operationally coupled between the second switch and the ground level,
- wherein the first switch and the second switch are configured to close and open alternately in response to a change in the voltage level of the oscillator signal.

19. The radio transceiver of claim 18, wherein the local oscillator signal is the first local oscillator signal, the frequency-mixing device further comprising an input port for a second local oscillator signal having the same frequency as the first local oscillator signal and a substantially opposite phase, and wherein the first switch is configured to close and open in response to the first local oscillator signal, and the second switch is configured to close and open in response to the second local oscillator signal.

20. The radio transceiver of claim 19, wherein the radio transceiver is configured to receive a radio frequency signal comprising an in-phase component and a quadrature component, and the radio transceiver comprises a separate frequency mixer for the in-phase component and the quadrature component.

21. The radio transceiver of claim 20, wherein the phases of the local oscillator signal applied to the frequency mixer associated with the quadrature component differ 90 degrees from the respective phases of the local oscillator signals applied to the frequency mixer associated with the in-phase component, and the local oscillator signals have a pulse ratio of 25/75 at most.

22. The radio transceiver of claim 20, further comprising a separate amplifier for each frequency mixer to precede the frequency mixers, and wherein the phases of the local oscillator signals applied to the frequency mixer associated with the quadrature component differ 90 degrees from the respective phases of the local oscillator signals applied to the frequency mixer associated with the in-phase component and the local oscillator signals have a pulse ratio of 50/50 at most.

23. The radio transceiver of claim 20, further comprising a phase shifter preceding at least one of the frequency mixers, and the phase shifter preceding at least one of the frequency mixers shifting the phase of at least one of the in-phase component and the quadrature component to produce a 90-degree phase difference between the in-phase component and the quadrature component.

24. The radio transceiver of claim 23, wherein the same local oscillator signals are applied to both frequency mixers.

25. The radio transceiver of claim 18, wherein the radio transceiver is a mobile communication device.

26. A frequency-mixing device comprising:
- a local oscillator providing a local oscillator signal having a frequency adapted to mix an input signal of the frequency-mixing device to a desired frequency;
- a first capacitance operationally coupled in series between an input port and an output port of the frequency-mixing device;
- a first switch operationally coupled between the first capacitance and a ground level;
- a second switch operationally coupled in series to the first capacitance, and
- a second capacitance operationally coupled between the second switch and the ground level,
- wherein the first switch and the second switch are configured to close and open alternately in response to a change in the voltage level of the oscillator signal.

27. A frequency-mixing device comprising:
- means for obtaining an oscillator signal having a frequency adapted to mix an input signal of the frequency-mixing device to a desired frequency;
- means for charging a first capacitance connected in series to an input port of the frequency-mixing device with an input signal sample during the first half cycle of the oscillator signal, and
- means for charging a second capacitance operationally coupled to the first capacitance with the charge in the first capacitance together with the input signal during the second half cycle of the oscillator signal.

* * * * *